US012331633B2

(12) United States Patent
Li et al.

(10) Patent No.: US 12,331,633 B2
(45) Date of Patent: Jun. 17, 2025

(54) HIGH VOLTAGE PROTECTION AND RECEIVER SATURATION PREVENTION APPARATUS WITH HIGH VOLTAGE PEEKING FUNCTIONS FOR DOWNHOLE LOGGING

(71) Applicant: Halliburton Energy Services, Inc., Houston, TX (US)

(72) Inventors: Peng Li, Houston, TX (US); Ziyang Li, Spring, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 508 days.

(21) Appl. No.: 16/581,026

(22) Filed: Sep. 24, 2019

(65) Prior Publication Data

US 2020/0116013 A1 Apr. 16, 2020

Related U.S. Application Data

(60) Provisional application No. 62/746,403, filed on Oct. 16, 2018.

(51) Int. Cl.
*E21B 47/12* (2012.01)
*E21B 41/00* (2006.01)
(Continued)

(52) U.S. Cl.
CPC .......... *E21B 47/12* (2013.01); *E21B 41/0085* (2013.01); *E21B 47/017* (2020.05);
(Continued)

(58) Field of Classification Search
CPC ...... E21B 7/12; E21B 47/017; E21B 41/0085; G01S 7/52017; G01V 3/24; G01V 11/002; H02H 9/04; H03G 11/002
See application file for complete search history.

(56) References Cited

U.S. PATENT DOCUMENTS 3,697,860 A * 10/1972 Baker .................. H02H 9/04
323/272
3,935,513 A * 1/1976 Suzuki .................. H02H 3/06
361/91.1
(Continued)

FOREIGN PATENT DOCUMENTS

JP 07-302392 11/1995
WO WO-2016191026 A1 * 12/2016 ......... E21B 47/0005
WO 2018-101966 6/2018

OTHER PUBLICATIONS

International Search Report and Written Opinion for Application No. PCT/US2019/053555, dated Jan. 17, 2020.
(Continued)

*Primary Examiner* — Yanick A Akaragwe
(74) *Attorney, Agent, or Firm* — Benjamin Ford; C. Tumey Law Group PLLC (57) ABSTRACT

A system for high voltage protection may comprise a high voltage protection module electrically connected to a transmitter module and a receiver module and a muting module connected to the high voltage protection module and the receiver module. A method for high voltage protection may comprise disposing a downhole tool into a wellbore, transmitting an excitation signal from the transmitter module to transceiver as a high voltage pulse signal to the high voltage protection module, reducing the high voltage pulse signal with the high voltage protection module, and preventing saturation of the receiver with a low impedance interface from the muting module.

21 Claims, 5 Drawing Sheets

(51) Int. Cl.
*E21B 47/017* (2012.01)
*G01S 7/52* (2006.01)
*G01V 3/24* (2006.01)
*G01V 11/00* (2006.01)
*H02H 9/04* (2006.01)
*H03G 11/00* (2006.01)

(52) U.S. Cl.
CPC ............ *G01S 7/52017* (2013.01); *G01V 3/24* (2013.01); *G01V 11/002* (2013.01); *H02H 9/04* (2013.01); *H03G 11/002* (2013.01)

(56) References Cited

U.S. PATENT DOCUMENTS

| | | | | |
|---|---|---|---|---|
| 4,875,130 | A | * | 10/1989 | Huard ................. H01L 27/0248 361/111 |
| 5,394,322 | A | * | 2/1995 | Hansen ................. G05B 13/045 700/32 |
| 5,841,853 | A | | 11/1998 | Yamanishi et al. |
| 5,966,427 | A | * | 10/1999 | Shaffer ............... H04M 1/2535 379/900 |
| 7,314,445 | B2 | | 1/2008 | Wodnicki et al. |
| 7,616,769 | B1 | * | 11/2009 | Shyu .................... H03G 11/002 381/74 |
| 8,254,073 | B1 | | 8/2012 | Choy et al. |
| 8,810,302 | B2 | | 8/2014 | Bottarel et al. |
| 9,416,629 | B2 | | 8/2016 | Hallundbaek et al. |
| 2008/0146181 | A1 | * | 6/2008 | Mason ................. H04L 25/063 455/234.1 |
| 2009/0212759 | A1 | * | 8/2009 | Melanson ............... H03M 3/41 341/143 |
| 2015/0036247 | A1 | | 2/2015 | Hsia |
| 2015/0364916 | A1 | | 12/2015 | Chung |
| 2016/0259086 | A1 | | 9/2016 | Grente et al. |
| 2018/0106837 | A1 | * | 4/2018 | Richmond, II .... G01R 1/06766 |
| 2018/0209252 | A1 | * | 7/2018 | Shanks ................. E21B 43/128 |

OTHER PUBLICATIONS

Halliburton, Sperry Drilling MWD/LWD Services, H07333, Jul. 2010.
Halliburton, Casing Integrity Monitoring for Mature Fields, H010381, Jul. 2013.
Halliburton, Xaminer Sonic Imager Service, H011818, Nov. 2018.
Norwegian Office Action for NO Patent Application No. 20210149 dated Mar. 25, 2025. PDF file. 6 pages.

* cited by examiner

HIGH VOLTAGE PROTECTION AND RECEIVER SATURATION PREVENTION APPARATUS WITH HIGH VOLTAGE PEEKING FUNCTIONS FOR DOWNHOLE LOGGING

BACKGROUND

Wellbores drilled into subterranean formations may enable recovery of desirable fluids (e.g., hydrocarbons) using any number of different techniques. Currently, drilling operations may identify subterranean formations through a bottom hole assembly if the subterranean formation is disposed horizontal to the bottom hole assembly. Measurement operations performed by downhole logging tools may identify properties within a wellbore and/or inside a formation. Current methods and system for downhole logging may emit a pressure pulse from a transceiver into a wellbore, record the echo, and process the echo to determine wellbore properties.

Currently, downhole transceivers interface with high voltage firing and low voltage sensing circuitry together in order to make a measurement. Protection circuitry is needed to make sure receiver circuitry is not damaged by the high voltage firing. Existing protection systems have limitation may protect a receiver from damages but may saturate the receiver and deform measurement taken by the downhole logging tool. Depending on saturation levels and extended period of time may pass before saturation is reduced. This may limit the response time of the receivers and may lead to inaccurate measurement. High voltage isolation induced receiver saturation may impact many types of downhole loggings, for example, in ultrasonic applications saturation may cause wrong caliper measurement and low quality impedance images. A high voltage peeking and measuring function during high voltage firing may be important for many types of downhole logging tools.

BRIEF DESCRIPTION OF THE DRAWINGS

These drawings illustrate certain aspects of some examples of the present disclosure and should not be used to limit or define the disclosure.

DETAILED DESCRIPTION

This disclosure may generally relate to a system and method of a bottom hole assembly measurement system configured with a muting circuitry to work together with a passive or active high voltage blocking circuitry. Additionally, systems and method may include a high voltage peeking function that may allow a high voltage signal to be measured at the same time, which may be beneficial for many types of downhole logging tools (ultrasonic/sonic/ NMR etc.). As used herein, the term "high voltage" refers to any voltage at 100 volts or greater and "low voltage" is any voltage less than 100 volts.

Figure 1:
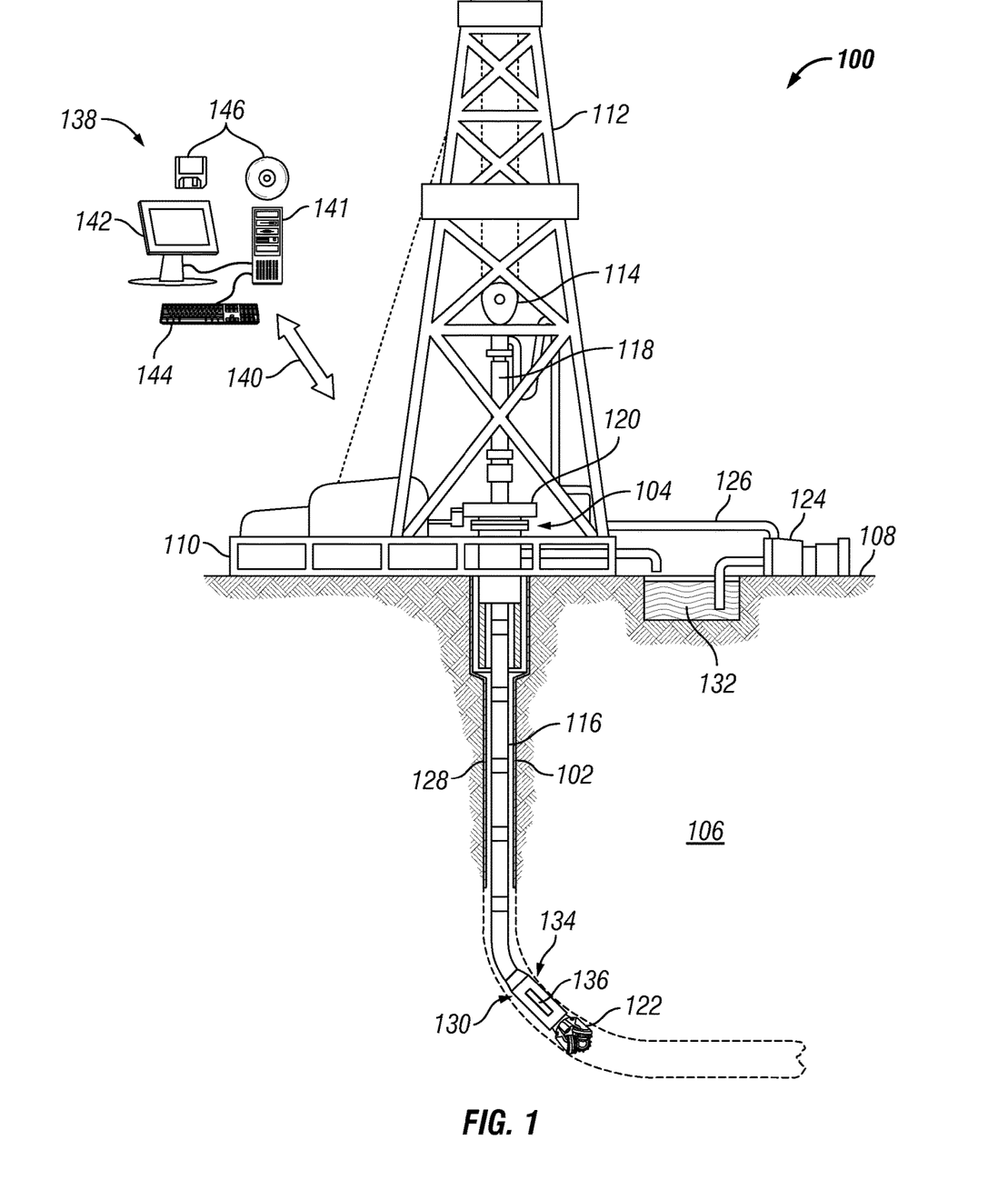
FIG. 1 illustrates an example of a drilling system.

FIG. 1 illustrates an example of a drilling system 100. As illustrated, wellbore 102 may extend from a wellhead 104 into a subterranean formation 106 from a surface 108. Generally, wellbore 102 may include horizontal, vertical, slanted, curved, and other types of wellbore geometries and orientations. Wellbore 102 may be cased or uncased. In examples, wellbore 102 may include a metallic member. By way of example, the metallic member may be a casing, liner, tubing, or other elongated steel tubular disposed in wellbore 102.

As illustrated, wellbore 102 may extend through subterranean formation 106. As illustrated in FIG. 1, wellbore 102 may extend generally vertically into the subterranean formation 106, however wellbore 102 may extend at an angle through subterranean formation 106, such as horizontal and slanted wellbores. For example, although FIG. 1 illustrates a vertical or low inclination angle well, high inclination angle or horizontal placement of the well and equipment may be possible. It should further be noted that while FIG. 1 generally depicts land-based operations, those skilled in the art may recognize that the principles described herein are equally applicable to subsea operations that employ floating or sea-based platforms and rigs, without departing from the scope of the disclosure.

As illustrated, a drilling platform 110 may support a derrick 112 having a traveling block 114 for raising and lowering drill string 116. Drill string 116 may include, but is not limited to, drill pipe and coiled tubing, as generally known to those skilled in the art. A kelly 118 may support drill string 116 as it may be lowered through a rotary table 120. A drill bit 122 may be attached to the distal end of drill string 116 and may be driven either by a downhole motor and/or via rotation of drill string 116 from surface 108. Without limitation, drill bit 122 may include, roller cone bits, PDC bits, natural diamond bits, any hole openers, reamers, coring bits, and the like. As drill bit 122 rotates, it may create and extend wellbore 102 that penetrates various subterranean formations 106. A pump 124 may circulate drilling fluid through a feed pipe 126 through kelly 118, downhole through interior of drill string 116, through orifices in drill bit 122, back to surface 108 via annulus 128 surrounding drill string 116, and into a retention pit 132.

With continued reference to FIG. 1, drill string 116 may begin at wellhead 104 and may traverse wellbore 102. Drill bit 122 may be attached to a distal end of drill string 116 and may be driven, for example, either by a downhole motor and/or via rotation of drill string 116 from surface 108. Drill bit 122 may be a part of bottom hole assembly 130 at a distal end of drill string 116. Bottom hole assembly 130 may further include tools for look-ahead resistivity applications. As will be appreciated by those of ordinary skill in the art, bottom hole assembly 130 may be a measurement-while drilling (MWD) or logging-while-drilling (LWD) system.

Bottom hole assembly 130 may comprise any number of tools, transmitters, and/or receivers to perform downhole measurement operations. For example, as illustrated in FIG. 1, bottom hole assembly 130 may include a measurement assembly 134. It should be noted that measurement assembly 134 may make up at least a part of bottom hole assembly 130. Without limitation, any number of different measurement assemblies, communication assemblies, battery assemblies, and/or the like may form bottom hole assembly 130 with measurement assembly 134. Additionally, measurement assembly 134 may form bottom hole assembly 130 itself. In examples, measurement assembly 134 may comprise at least one transducer 136, which may be disposed at the surface of measurement assembly 134. It should be noted that transducer 136 may also be referred to as a transducer. Without limitation, transducer 136 may also be disposed within measurement assembly 134 and there may be four transducers 136 that may be disposed ninety degrees from each other. However, it should be noted that there may be any number of transducers 136 disposed along bottom hole assembly 130 at any degree from each other. Transducers 136 may function and operate to generate an acoustic pressure pulse that travels through borehole fluids. In examples, transducers 136 may further sense and acquire the reflected pressure wave which is modulated (i.e., reflected as an echo) by the borehole wall. During measurement operations, the travel time of the pulse wave from transmission to recording of the echo may be recorded. This information may lead to determining a radius of the borehole, which may be derived by the fluid sound speed. By analyzing the amplitude of the echo signal, the acoustic impedance may also be derived. Without limitation, transducers 136 may be made of piezo-ceramic crystals, or optionally magnetostrictive materials or other materials that generate an acoustic pulse when activated electrically or otherwise. In examples, transducers 136 may also include backing materials and matching layers. It should be noted that transducers 136 and assemblies housing transducers 136 may be removable and replaceable, for example, in the event of damage or failure.

Without limitation, bottom hole assembly 130 may be connected to and/or controlled by information handling system 138, which may be disposed on surface 108. Without limitation, information handling system 138 may be disposed down hole in bottom hole assembly 130. Processing of information recorded may occur down hole and/or on surface 108. Processing occurring downhole may be transmitted to surface 108 to be recorded, observed, and/or further analyzed. Additionally, information recorded on information handling system 138 that may be disposed down hole may be stored until bottom hole assembly 130 may be brought to surface 108. In examples, information handling system 138 may communicate with bottom hole assembly 130 through a communication line (not illustrated) disposed in (or on) drill string 116. In examples, wireless communication may be used to transmit information back and forth between information handling system 138 and bottom hole assembly 130. Information handling system 138 may transmit information to bottom hole assembly 130 and may receive as well as process information recorded by bottom hole assembly 130. In examples, a downhole information handling system (not illustrated) may include, without limitation, a microprocessor or other suitable circuitry, for estimating, receiving and processing signals from bottom hole assembly 130. Downhole information handling system (not illustrated) may further include additional components, such as memory, input/output devices, interfaces, and the like. In examples, while not illustrated, bottom hole assembly 130 may include one or more additional components, such as analog-to-digital converter, filter, and amplifier, among others, that may be used to process the measurements of bottom hole assembly 130 before they may be transmitted to surface 108. Alternatively, raw measurements from bottom hole assembly 130 may be transmitted to surface 108.

Any suitable technique may be used for transmitting signals from bottom hole assembly 130 to surface 108, including, but not limited to, wired pipe telemetry, mud-pulse telemetry, acoustic telemetry, and electromagnetic telemetry. While not illustrated, bottom hole assembly 130 may include a telemetry subassembly that may transmit telemetry data to surface 108. At surface 108, pressure transducers (not shown) may convert the pressure signal into electrical signals for a digitizer (not illustrated). The digitizer may supply a digital form of the telemetry signals to information handling system 138 via a communication link 140, which may be a wired or wireless link. The telemetry data may be analyzed and processed by information handling system 138.

As illustrated, communication link 140 (which may be wired or wireless, for example) may be provided that may transmit data from bottom hole assembly 130 to an information handling system 138 at surface 108. Information handling system 138 may include a personal computer 141, a video display 142, a keyboard 144 (i.e., other input devices.), and/or non-transitory computer-readable media 146 (e.g., optical disks, magnetic disks) that can store code representative of the methods described herein. In addition to, or in place of processing at surface 108, processing may occur downhole.

As discussed below, methods may be utilized by information handling system 138 to determine properties of subterranean formation 106. Information may be utilized to produce an image, which may be generated into, one, two or three-dimensional models of subterranean formation 106. These models may be used for well planning, (e.g., to design a desired path of wellbore 102). Additionally, they may be used for planning the placement of drilling systems within a prescribed area. This may allow for the most efficient drilling operations to reach a subsurface structure. During drilling operations, measurements taken within wellbore 102 may be used to adjust the geometry of wellbore 102 in real time to reach a geological target. Measurements collected from bottom hole assembly 130 of the formation properties may be used to steer drilling system 100 toward a subterranean formation 106. Optionally, these measurements may be used to plan well completion operations, including but not limited to placement of packers, hydraulic fracturing, cementing, acidizing or the placement of mud-loss mitigation treatments. Optionally, these measurements may be used for reservoir or over-burden characterization purposes.

Figure 2:
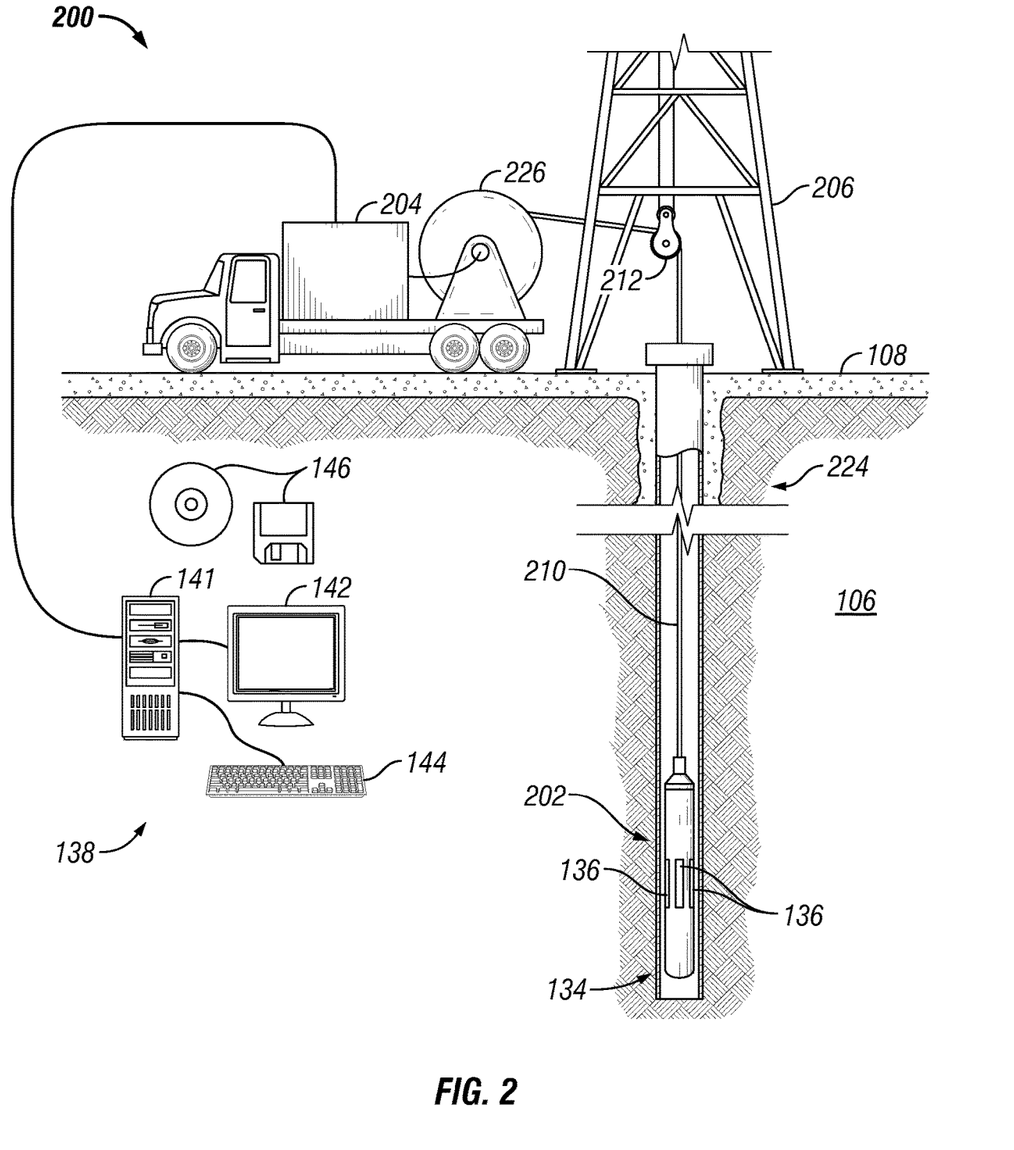
FIG. 2 illustrates an example of a well measurement system.

FIG. 2 illustrates a cross-sectional view of an example of a well measurement system 200. As illustrated, well measurement system 200 may comprise downhole tool 202 attached a vehicle 204. In examples, it should be noted that downhole tool 202 may not be attached to a vehicle 204. Downhole tool 202 may be supported by rig 206 at surface 108. Downhole tool 202 may be tethered to vehicle 204 through conveyance 210. Conveyance 210 may be disposed around one or more sheave wheels 212 to vehicle 204. Conveyance 210 may include any suitable means for providing mechanical conveyance for downhole tool 202, including, but not limited to, wireline, slickline, coiled tubing, pipe, drill pipe, downhole tractor, or the like. In some embodiments, conveyance 210 may provide mechanical suspension, as well as electrical and/or optical connectivity, for downhole tool 202. Conveyance 210 may comprise, in some instances, a plurality of electrical conductors and/or a plurality of optical conductors extending from vehicle 204, which may provide power and telemetry. In examples, an optical conductor may utilize a battery and/or a photo conductor to harvest optical power transmitted from surface 108. Conveyance 210 may comprise an inner core of seven electrical conductors covered by an insulating wrap. An inner and outer steel armor sheath may be wrapped in a helix in opposite directions around the conductors. The electrical and/or optical conductors may be used for communicating power and telemetry between vehicle 204 and downhole tool 202. Information from downhole tool 202 may be gathered and/or processed by information handling system 138. For example, signals recorded by downhole tool 202 may be stored in memory and then processed by downhole tool 202. The processing may be performed real-time during data acquisition or after recovery of downhole tool 202. Processing may alternatively occur downhole or may occur both downhole and at surface. In some embodiments, signals recorded by downhole tool 202 may be conducted to information handling system 138 by way of conveyance 210. Information handling system 138 may process the signals, and the information contained therein may be displayed for an operator to observe and stored for future processing and reference. Information handling system 138 may also contain an apparatus for supplying control signals and power to downhole tool 202.

Systems and methods of the present disclosure may be implemented, at least in part, with information handling system 138. While shown at surface 108, information handling system 138 may also be located at another location, such as remote from borehole 224. Information handling system 138 may include any instrumentality or aggregate of instrumentalities operable to compute, estimate, classify, process, transmit, receive, retrieve, originate, switch, store, display, manifest, detect, record, reproduce, handle, or utilize any form of information, intelligence, or data for business, scientific, control, or other purposes. For example, an information handling system 138 may be a personal computer 141, a network storage device, or any other suitable device and may vary in size, shape, performance, functionality, and price. Information handling system 138 may include random access memory (RAM), one or more processing resources such as a central processing unit (CPU) or hardware or software control logic, ROM, and/or other types of nonvolatile memory. Additional components of the information handling system 138 may include one or more disk drives, one or more network ports for communication with external devices as well as various input and output (I/O) devices, such as a keyboard 144, a mouse, and a video display 142. Information handling system 138 may also include one or more buses operable to transmit communications between the various hardware components. Furthermore, video display 142 may provide an image to a user based on activities performed by personal computer 141. For example, producing images of geological structures created from recorded signals. By way of example, a video display unit may produce a plot of depth versus the two cross-axial components of the gravitational field and versus the axial component in borehole coordinates. The same plot may be produced in coordinates fixed to the Earth, such as coordinates directed to the North, East and directly downhole (Vertical) from the point of entry to the borehole. A plot of overall (average) density versus depth in borehole or vertical coordinates may also be provided. A plot of density versus distance and direction from the borehole versus vertical depth may be provided. It should be understood that many other types of plots are possible when the actual position of the measurement point in North, East and Vertical coordinates is taken into account. Additionally, hard copies of the plots may be produced in paper logs for further use.

Alternatively, systems and methods of the present disclosure may be implemented, at least in part, with non-transitory computer-readable media 146. Non-transitory computer-readable media 146 may include any instrumentality or aggregation of instrumentalities that may retain data and/or instructions for a period of time. Non-transitory computer-readable media 146 may include, for example, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such wires, optical fibers, microwaves, radio waves, and other electromagnetic and/or optical carriers; and/or any combination of the foregoing.

In examples, rig 206 includes a load cell (not shown) which may determine the amount of pull on conveyance 210 at the surface of borehole 224. Information handling system 138 may comprise a safety valve (not illustrated) which controls the hydraulic pressure that drives drum 226 on vehicle 204 which may reel up and/or release conveyance 210 which may move downhole tool 202 up and/or down borehole 224. The safety valve may be adjusted to a pressure such that drum 226 may only impart a small amount of tension to conveyance 210 over and above the tension necessary to retrieve conveyance 210 and/or downhole tool 202 from borehole 224. The safety valve is typically set a few hundred pounds above the amount of desired safe pull on conveyance 210 such that once that limit is exceeded, further pull on conveyance 210 may be prevented.

As illustrated in FIG. 2, downhole tool 202 may include measurement assembly 134. It should be noted that measurement assembly 134 may make up at least a part of downhole tool 202. Without limitation, any number of different measurement assemblies, communication assemblies, battery assemblies, and/or the like may form downhole tool 202 with measurement assembly 134. Additionally, measurement assembly 134 may form downhole tool 202 itself. In examples, measurement assembly 134 may comprise at least one transducer 136, which may be disposed at the surface of measurement assembly 134. Without limitation, transducer 136 may also be disposed within measurement assembly 134. Without limitation, there may be four transducers 136 that may be disposed ninety degrees from each other. However, it should be noted that there may be any number of transducers 136 disposed along bottom hole assembly 130 at any degree from each other. Transducers 136 may function and operate to generate and receive acoustic pulses in the borehole fluid.

Figure 3:
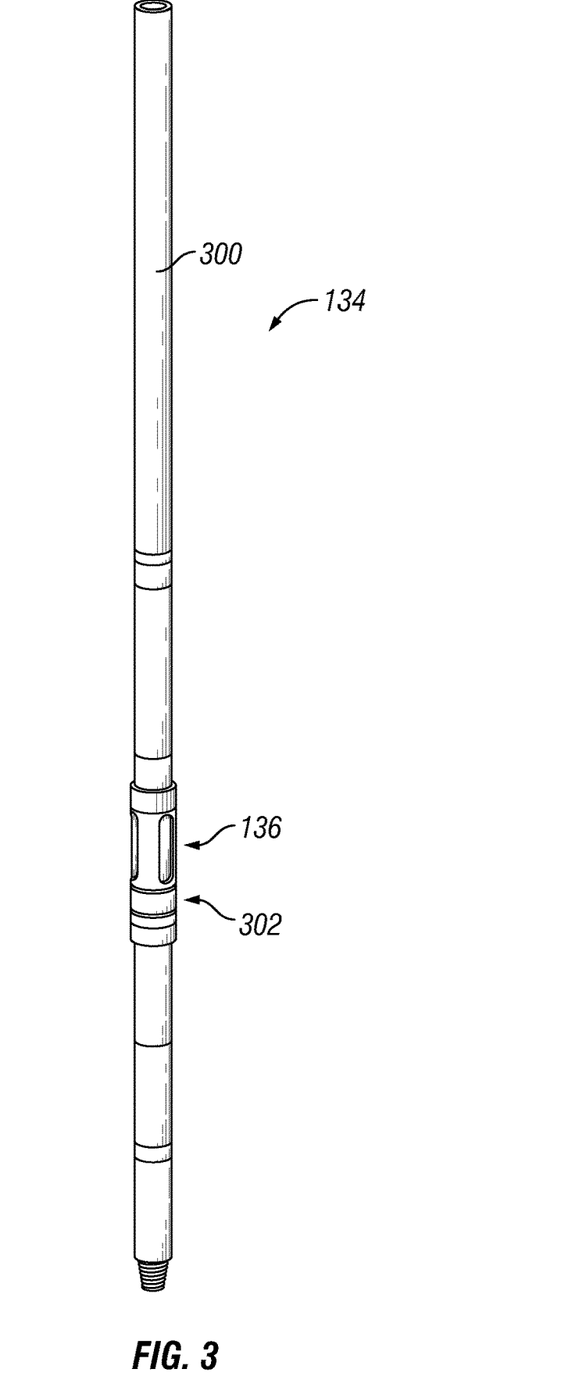
FIG. 3 illustrates an example of a measurement assembly.

FIG. 3 illustrates a close-up view of measurement assembly 134. As illustrated, measurement assembly 134 may include at least one battery section 300 and at least one instrument section 302. Battery section 300 may operate and function to enclose and/or protect at least one battery that may be disposed in battery section 300. Without limitation, battery section 300 may also operate and function to power measurement assembly 134. Specifically, battery section 300 may power at least one transducer 136, which may be disposed at any end of battery section 300 in instrument section 302.

Instrument section 302 may house at least one transducer 136. Transducers 136 may function and operate to generate and record excitations within a borehole. For example, during operations, transducer 136 may transmit an excitation into wellbore 102 (e.g., referring to FIG. 1). Without limitation, the excitation may be in the form of a pressure pulse, current, electromagnetic field, radio frequency, and/or any other suitable medium. This may allow for transducer 136 to be an ultrasonic device, acoustic device, electromagnetic device, radio frequency device, and/or the like. In examples, may be made of piezo-ceramic crystals, or optionally magnetostrictive materials or other materials that generate an acoustic pulse when activated electrically or otherwise. In one or more examples, transducers 136 may also include backing materials and matching layers. Additionally, transducer 136 may include coils, antennas, and/or the like. It should be noted that transducers 136 and/or instrument section 302 may be removable and replaceable, for example, in the event of damage or failure.

During operations, in examples where transducer 136 may emit a pressure wave, specifically an ultrasonic pressure pulse wave, the pressure pulse may have a frequency range from about 10 kHz to about 100 kHz, for example, with a center of about 250 kHz. It should be noted that the pulse signal may be emitted with different frequency content. Recordings and/or measurements taken by transducer 136 may be transmitted to information handling system 138 by any suitable means, as discussed above. Transmission may be performed in real-time (transmitted to the surface via mud-pulse, wired-pipe or other telemetry) or post-drill (from data stored in the tool memory and recovered at the surface during tripping).

In examples, transducers 136 may further sense and record the transmission of the excitation. The excitation may travel from transducer 136 and reflect off a borehole wall. The reflected excitation is defined as an echo, which is recorded by transducer 136. Without limitation, transducers 136 may measure the excitation as it travels from transducer 136 and is reflected back to transducer 136 as an echo.

Measurements may be used to form images of the surrounding borehole and/or subterranean formation. To generate these images, measurement assembly 134 may utilize one or more transducers 136 positioned at varying azimuths around the circumference of measurement assembly 134. In examples, each transducer 136 may operate and function independently emitting an excitation and detecting its reflection from the borehole wall as a reflected echo.

The amplitude of the received echo at each transducer 136 may be stacked into composite spatial bins or pixels (typically of 1- or 2-degree width and ¼ inch (0.6 cm) height) at each depth. Stacking may be defined as taking the mean, or median, or harmonic mean, or trimmed-mean (where the larger and smaller outliers are discarded) of the values of all the reflection amplitude measurements falling into each pixel. This list of definitions of the term stacking should not be taken to be exhaustive and those skilled in the art could easily derive alternative means of averaging. However, irrespective of the stacking method used the resulting image may be a sum of contributions from two or more transducers.

Figure 4:
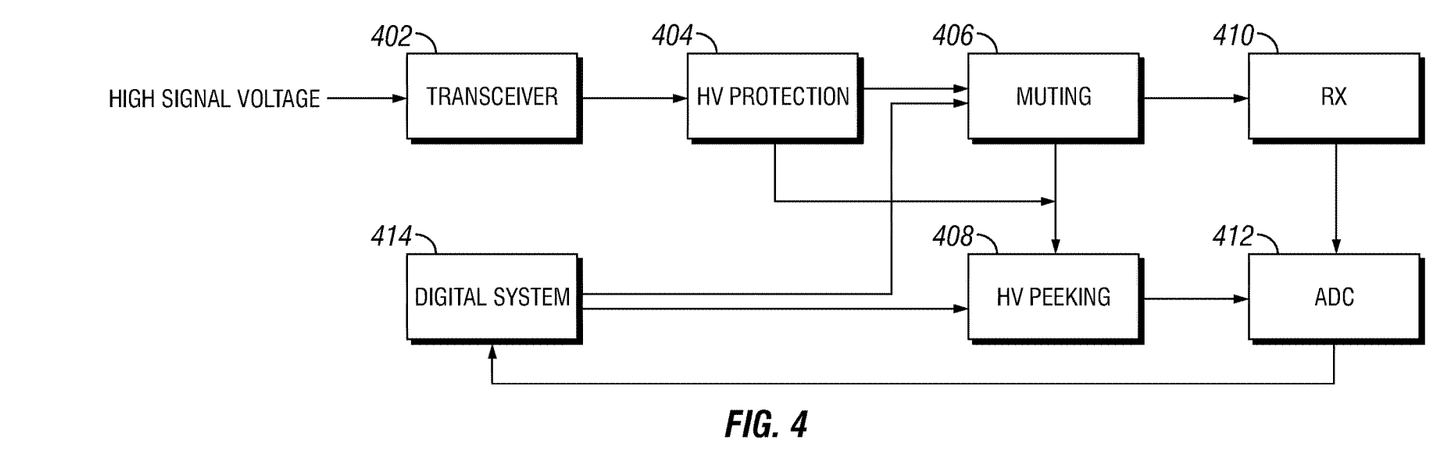
FIG. 4 illustrates an example block diagram of the measurement assembly.

FIG. 4 illustrates an example of a block diagram 400 that may illustrate circuitry and/or devices disposed in measuring assembly 134 (e.g., referring to FIG. 3). As illustrated, measuring assembly 134 may comprise a transceiver 402. It should be noted that transceiver 402 may also be referred to as a "pinger" and/or transducer 136 (e.g., referring to FIG. 1). Without limitation, additional components may include a high voltage protection module 404, a controllable muting module 406, a high voltage peeking module 408, a receiver 410, an analog to digital converter or ADC 412, and/or a digital control system 414. As illustrated in FIG. 4, transceiver 402 may be connected to high voltage protection module 404. A high voltage signal may activate transceiver 402 to transmit an excitation. The activation of transceiver 402 may activate high voltage protection module 404, which may prevent the high voltage signal from passing through high voltage protection module 404 to the rest of the components in measuring assembly 134. In examples, a lower voltage may pass through high voltage protection module 404 to muting module 406 and high voltage peeking module 408. Both muting module 406 and high voltage peeking module 408 are connected to and may be controlled by digital control system 414. Muting module 406 is connected to receiver 410, which may be activated by muting module 406. Receiver 410 may then record and/or measure a returning excitation, such as an echo, in the form of a signal. This recorded and/or measured signal may be transmitted to an ADC 412, which may convert the recorded and/or measured signal into a digital signal. ADC 412 is connected to digital control system 414. The digital signal may be sent to digital control system 414. The digital control system 414 may store the recorded and/or measured signal and alter operations of muting module 406 and high voltage peeking module 408 based at least in part on the recorded and/or measured signal.

For example, the digital control system 414 may engage muting module 406 so that a low impedance interface may be presented across the input to receiver 410. With the low impedance (e.g., 1 ohm or less) following high voltage protection module 404, at least a part of the high voltage across transceiver 402 may be applied in parallel and taken by high impedance high voltage protection module 404. Therefore, receiver 410 may be protected during operations when a high voltage may be present in measuring assembly 134 (e.g., referring to FIG. 3). In examples, receiver 410 may be of a high input impedance type (e.g. common instrumentation amplifiers), although common high impedance high voltage protection module 404 may take most of the voltage drop from the high voltage and protect receiver 410 from being damaged, it cannot prevent receiver 410 from being saturated. Depending on the saturation level, it may take an extended amount of time to recover from saturation. This greatly limits the response time of the receiver 410 and may lead to incorrect measurement. In examples, a low impedance environment from muting module 406 makes even high input impedance receivers 410 immune from saturation problems. In addition, muting module 406 may also provide benefits after transmission of a pressure pulse by transceiver 402. For example, before a receiving signal (e.g., a reflection of the pressure pulse, an echo) needs to be read, muting module 406 may be kept engaged, which may mute any induced "ringing" from the transmission of the pressure pulse. By keeping muting module 406 functioning for certain period of time (which may be referred to as "mute time" and may be controlled by digital control system 414) after transmission of a pressure pulse, the initial part of the received signal (e.g., echo) may be dumped (discarded and not measured and/or recorded) rather than fed into receiver 410. For transceivers 402 with consistent ringing period, a "mute time" may be determine and programmed into digital control system 414 to perform proper hardware muting. This hardware level ringing removal enables cleaner signals for acquiring and easier data processing afterwards.

During operations in which high voltage protection and muting receiver 410 may be performed, high voltage peeking module 408 may provide a backdoor for measuring a high voltage transmitting waveform. The high voltage peeking module 408 may include a resistor with circuitry for measuring a voltage drop across the resistor. For example, a small resistor (e.g., below 1 ohm) may be placed in series with the muting module 406 with the voltage drop measured across this small resistor during muting engaged time. Both of these functions may be valuable for many types of downhole logging tools.

Figure 5:
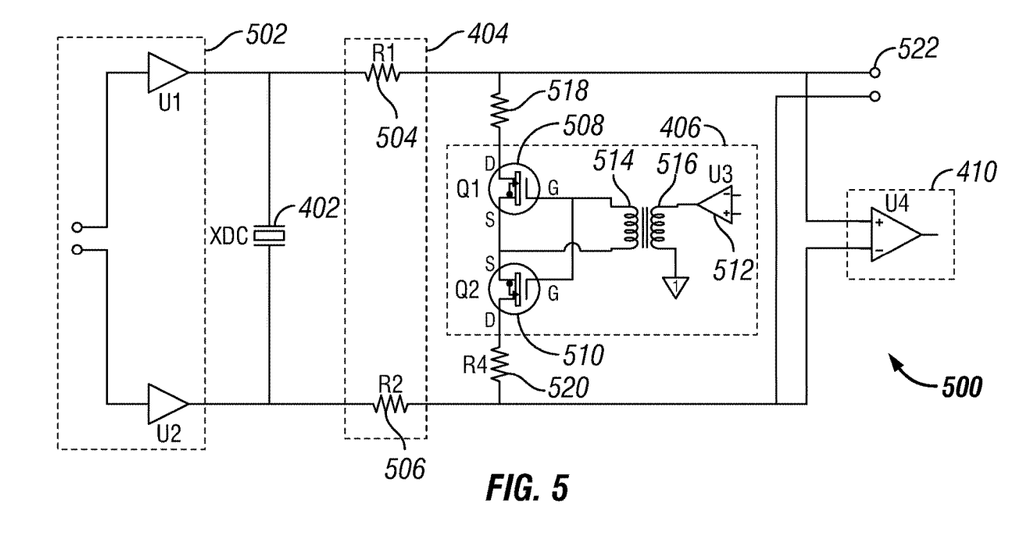
FIG. 5 illustrates an example circuitry diagram of the measurement assembly.

FIG. 5 illustrates example of a circuitry diagram 500 of block diagram 400 (e.g., referring to FIG. 4) for an ultrasonic application. As illustrated a transmitter module 502 may generate a high voltage pulse signal to drive transceiver 402 to fire an ultrasonic pressure signal. As noted above, high voltage is 100 volts or greater, therefore the high voltage pulse signal may be 100 volts or greater. During transmission, high voltage protection module 404 and muting module 406, together, block the high voltage pulse signal from being input into receiver 410. In this example, high voltage protection module 404 may utilize an active blocking method that may include devices such as a first resistor 504 and a second resistor 506. It should be noted that first resistor 504 and second resistor 506 may be large (e.g., more than ten kilo ohms) resistors. As illustrated, muting module 406 may include a first transistor 508 and a second transistor 510, which may be connected together to a single source and/or individual sources. Without limitation, suitable transistors may include, but are not limited to, a Field Effect Transistors (FETs). The gates of transistors 508 and 510 may be connected to a common gate drive circuit with a first transformer winding 514. Devices in muting module 406 may be turned on by sending a control signal from digital control system 414 (e.g., referring to FIG. 4) to an amplifier 512 coupled to second transformer winding 516, which may cause transformer winding 516 to generate a voltage across transistor winding 514. This results in a gate voltage applied to both first transistor 508 and second transistor 510, causing the drain and source to be shorted.

Additionally, third resistor 518 and fourth resistor 520 may be small (e.g., 1 ohm or less) in value. In examples, the high voltage firing signal current passes first resistor 504, third resistor 518, fourth resistor 520, second resistor 506 and may loop back without entering receiver 410. Additionally, high voltage peeking module 408 may monitor differential voltage on third resistor 518 and fourth resistor 520, which may be a voltage drop across third resistor 518 and fourth resistor 520 and may measure and/or calculate the firing voltage at the transceiver 402. Without limitation, third resistor 518 and fourth resistor 520 may be a metal-oxide-semiconductor field-effect transistor (MOSFET) or a transistor device configured in high impedance modes, where the impedance is above 2 ohms. It should be noted, as illustrated in FIG. 5, a node 522 may be used as another form of measurement for a voltage drop across third resistor 518, fourth resistor 520, and may measure and/or calculate the firing voltage at the transceiver 402. After transmission of a pressure pulse by transceiver 402, as described above, digital control system 414 may continue to control first transistor 508 and second transistor 510 for a calculated period of time to ensure more energy is dumped and muted to prevent saturation of the received signal by transceiver 402. The calculated period of time may be the time in order to reduce transceiver ringdown amplitude, which may create a dead time window for echo measurements. Ringdown is the vibration of transceiver 402 after a transmission of an excitation from transceiver 402.

Figure 6:
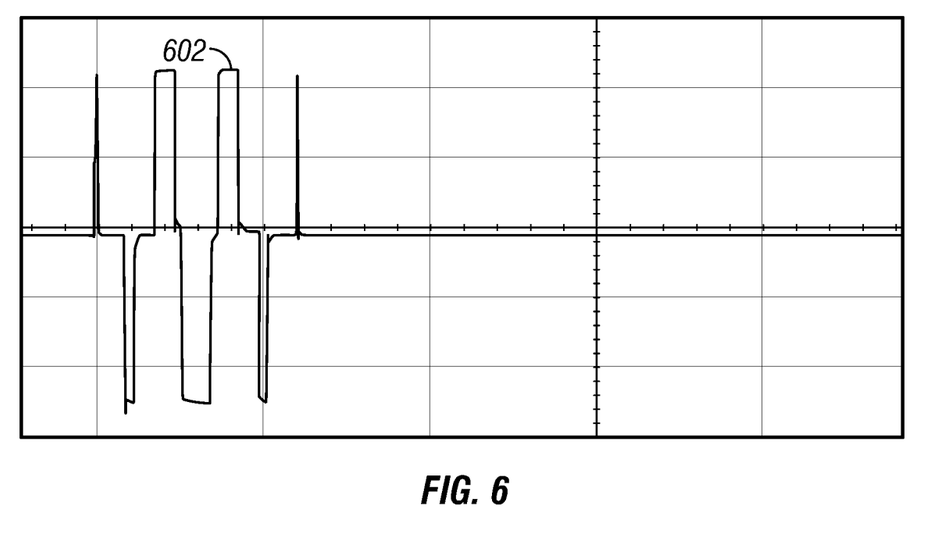
FIG. 6 is a graph of a firing pulse signal.
Figure 7:
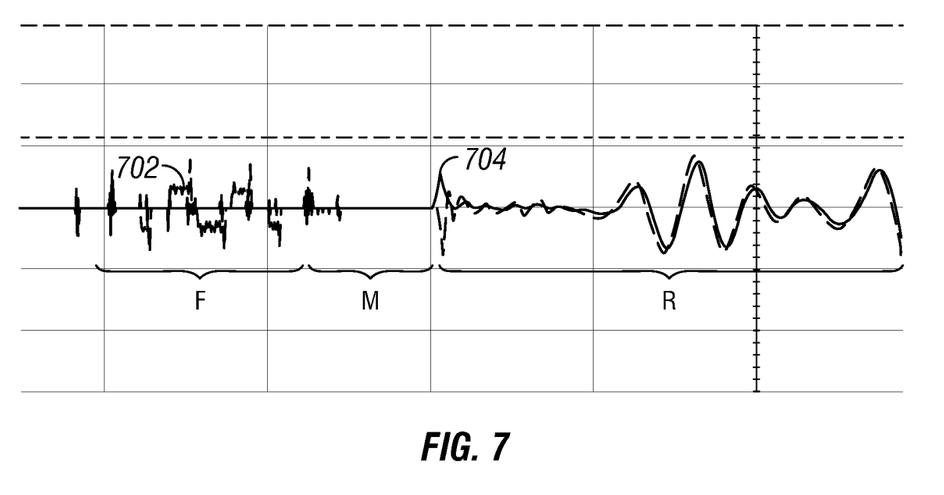
FIG. 7 is a graph measuring a first channel and a second channel.

FIG. 6 shows simulated data of an example 100V peak-to-peak firing signal 602 generated by the transmitter module 502 (e.g., referring to FIG. 5). FIG. 7 is a graph of simulated data demonstrating the effectiveness of the circuitry and device in circuitry diagram 500 (e.g., referring to FIG. 5). First channel 702 has high voltage peeking features, discussed above (e.g., third resistor 518 and fourth resistor 520 coupled with the muting circuitry). Second channel 704 does not have high voltage peeking feature enabled. When muting module 406 (e.g., referring to FIGS. 4 and 5) is engaged, normally during both firing and muting period (F and M period in FIG. 7), both channels have the received signal muted, (i.e., no high voltage firing signal or big ringing noise was measured in receiver 410). Due to the usage of a high voltage peeking function, first channel 702 may include a leakage of the firing signal in the receiver. This may be due to third resistor 518 and fourth resistor 520 absorbing a voltage drop due to a firing voltage during transmission. Second channel 704, without high voltage peeking module 408 may not have leakage. When muting module 406 is released (R period in FIG. 7), the normal receiving signal from transceiver 402 may be absorbed by receiver 410 (e.g., referring to FIG. 5).

It will be appreciated by those of ordinary skill in the art, exemplary examples of the system and individual devices of the present disclosure may be used in a variety of subterranean applications, including imaging. Exemplary examples of the system and devices may be introduced into a subterranean formation and utilized to image a borehole and the surrounding formation. While the preceding discussion is directed to the use of downhole imaging, those of ordinary skill in the art will also appreciate that it may be desirable to utilize other types of imaging in the marine field, medical field, aerospace field, and defense field in accordance with examples of the present disclosure.

The systems and methods for a high protection and receiver saturation prevention apparatus within any suitable tool may include any of the various features of the systems and methods disclosed herein, including one or more of the following statements.

Statement 1: A system may comprise a high voltage protection module electrically connected to a transmitter module and a receiver module, and a muting module connected to the high voltage protection module and the receiver module.

Statement 2: The system of statement 1, wherein the high voltage protection module is configured to reduce a high voltage pulse signal to a receiver.

Statement 3: The system of statements 1 or 2, wherein the muting module comprises a first transistor and a second transistor and is configured to prevent saturation of the receiver module with a low impedance interface.

Statement 4. The system of statement 3, wherein the muting module further comprises an amplifier and a transformer winding, wherein a digital control system is connected to the amplifier and the digital control system is configured to operate the amplifier.

Statement 5. The system of statements 1-3, wherein the transmitter module is configured to transmit an excitation signal which traverses from the transmitter module to the high voltage protection module.

Statement 6. The system of statements 1-3 or 5, wherein the high voltage protection module comprises a first resistor and a second resistor.

Statement 7. The system of statement 6, wherein the first resistor and the second resistor are each individually ten kilo-ohms or greater.

Statement 8. The system of statement 7, further comprising a third resistor and a fourth resistor, wherein the third resistor and the fourth resistor are each individually less than one ohm.

Statement 9. The system of statement 8, further comprising a high voltage peeking module configured to monitor voltage drop across the third resistor and the fourth resistor.

Statement 10. The system of statements 1-3, 5, or 6, further comprising an analog to digital converter connected to the receiver module.

Statement 11. A downhole tool may comprise a transmitter module, wherein the transmitter module is configured to transmit a high voltage pulse signal, a high voltage protection module connected to the transmitter module and a receiver module, wherein the high voltage protection module is configured to reduce the high voltage pulse signal to a receiver, a transceiver connected to the transmitter module and the high voltage protection module, wherein the transceiver is configured to emit an excitation and sense a response, a muting module connected to the high voltage protection module and the receiver, wherein the muting module is configured to prevent saturation of the receiver with a low impedance interface, and an analog to digital converter connected to the receiver.

Statement 12. The downhole tool of statement 11, wherein the excitation is a pressure pulse that has a frequency range of about 10 kHz to about 500 kHz.

Statement 13. The downhole tool of statements 11 or 12, wherein the high voltage protection module comprise a passive switch.

Statement 14. The downhole tool of statements 11-13, wherein the muting module comprises a first transistor, a second transistor, an amplifier, and a transformer winding, wherein a digital control system is connected to the amplifier and the digital control system is configured to operate the amplifier.

Statement 15. The downhole tool of statement 14, further comprising a high voltage peeking module, wherein the high voltage peeking module is configured to monitor voltage drop across a third resistor and a fourth resistor.

Statement 16. A method may comprise disposing a downhole tool into a wellbore, wherein the downhole tool may comprise a digital control system, a transceiver configured to emit a pressure pulse, a transmitter module configured to transmit an excitation signal, a high voltage protection module connected to the transmitter module, a muting module connected to the high voltage protection module, a receiver connected to the muting module, and an analog to digital converter. The system method may further comprise transmitting an excitation signal from the transmitter module to transceiver as a high voltage pulse signal to the high voltage protection module, reducing the high voltage pulse signal with the high voltage protection module, and preventing saturation of the receiver with a low impedance interface from the muting module.

Statement 17. The method of statement 16, further comprising activating an amplifier in the muting module with the digital control system.

Statement 18. The method of statement 17, further comprising activating a first transistor and a second transistor in the muting module with the amplifier.

Statement 19. The method of statement 18, further comprising measuring a voltage drop across a third resistor and a fourth resistor with a high voltage peeking module.

Statement 20. The method of statement 19, further comprising controlling the high voltage peeking module with the digital control system.

It should be understood that, although individual examples may be discussed herein, the present disclosure covers all combinations of the disclosed examples, including, without limitation, the different component combinations, method step combinations, and properties of the system. It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the element that it introduces.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present examples are well adapted to attain the ends and advantages mentioned as well as those that are inherent therein. The particular examples disclosed above are illustrative only, and may be modified and practiced in different but equivalent manners apparent to those skilled in the art having the benefit of the teachings herein. Although individual examples are discussed, the disclosure covers all combinations of all of the examples. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative examples disclosed above may be altered or modified and all such variations are considered within the scope and spirit of those examples. If there is any conflict in the usages of a word or term in this specification and one or more patent(s) or other documents that may be incorporated herein by reference, the definitions that are consistent with this specification should be adopted.

What is claimed is:

1. A system comprising:
   a high voltage protection module electrically connected to a transmitter module and a receiver module, wherein the high voltage protection module comprises a first resistor and a second resistor that are in parallel;
   a high voltage peeking module wherein the high voltage peeking module measures a firing voltage at a transceiver; and
   a muting module connected to the high voltage protection module and the receiver module, wherein the muting module is configured to prevent saturation of the receiver module with a low impedance interface.

2. The system of claim 1, wherein the high voltage protection module is configured to reduce a high voltage pulse signal to a receiver.

3. The system of claim 1, wherein the muting module comprises a first transistor and a second transistor and is configured to prevent saturation of the receiver module with a low impedance interface.

4. The system of claim 3, wherein the muting module further comprises an amplifier and a transformer winding, wherein a digital control system is connected to the amplifier and the digital control system is configured to operate the amplifier.

5. The system of claim 1, wherein the transmitter module is configured to transmit an excitation signal which traverses from the transmitter module to the high voltage protection module.

6. The system of claim 1, wherein the first resistor and the second resistor are each individually ten kilo ohms or greater.

7. The system of claim 6, wherein one element from the at least two elements is a third resistor.

8. The system of claim 7, wherein the third resistor is less than one ohm.

9. The system of claim 1, further comprising an analog to digital converter connected to the receiver module.

10. A downhole tool comprising:
 a transmitter module, wherein the transmitter module is configured to transmit a high voltage pulse signal from an output of the transmitter module;
 a high voltage protection module connected to the output of the transmitter module and an input of a receiver module, wherein the high voltage protection module is configured to reduce the high voltage pulse signal to a receiver, and wherein the high voltage protection module comprises a first resistor and a second resistor that are in parallel;
 a transceiver connected to the output of the transmitter module and a high voltage protection module input, wherein the transceiver is configured to emit an excitation and sense a response;
 a muting module input connected to the high voltage protection module output and the input of the receiver module, wherein a muting module is configured to prevent saturation of the receiver module with a low impedance interface; and
 an analog to digital converter connected to a receiver module output.

11. The downhole tool of claim 10, wherein the excitation is a pressure pulse that has a frequency range of about 10 kHz to about 500 kHz.

12. The downhole tool of claim 10, wherein the high voltage protection module comprise a passive switch.

13. The downhole tool of claim 10, wherein the muting module comprises a first transistor, a second transistor, an amplifier, and a transformer winding, wherein a digital control system is connected to the amplifier and the digital control system is configured to operate the amplifier.

14. The downhole tool of claim 13, further comprising a high voltage peeking module, wherein the high voltage peeking module is configured to monitor voltage drop across a third resistor and a fourth resistor.

15. A method comprising:
 disposing a downhole tool into a wellbore, wherein the downhole tool comprises:
  a digital control system;
  a transceiver configured to emit a pressure pulse;
  a transmitter module configured to transmit an excitation signal;
  a high voltage protection module with a first resistor and a second resistor that are in parallel connected to the transmitter module;
  a muting module connected to the high voltage protection module;
  a receiver connected to the muting module; and
  an analog to digital converter;
 transmitting the excitation signal from the transmitter module to the transceiver as a high voltage pulse signal to the high voltage protection module;
 reducing the high voltage pulse signal with the high voltage protection module; and
 preventing saturation of the receiver with a low impedance interface from the muting module.

16. The method of claim 15, further comprising activating an amplifier in the muting module with the digital control system.

17. The method of claim 16, further comprising activating a first transistor and a second transistor in the muting module with the amplifier.

18. The method of claim 17, further comprising measuring a voltage drop across a third resistor and a fourth resistor with a high voltage peeking module.

19. The method of claim 18, further comprising controlling the high voltage peeking module with the digital control system.

20. A system comprising:
 a high voltage protection module electrically connected to a transmitter module and a receiver module; and
 a muting module connected to the high voltage protection module and the receiver module wherein the muting module comprises a first transistor and a second transistor and is configured to prevent saturation of the receiver module with a low impedance interface and an amplifier and a transformer winding, wherein a digital control system is connected to the amplifier and the digital control system is configured to operate the amplifier, wherein the muting module is configured to remain engaged after transmission of a pressure pulse.

21. A system comprising:
 a high voltage protection module electrically connected to a transmitter module and a receiver module, wherein the high voltage protection module comprises a first resistor and a second resistor that are in parallel and each individually ten kilo ohms or greater;
 a third resistor and a fourth resistor each individually less than one ohm;
 a high voltage peeking module configured to monitor voltage drop across the third resistor and the fourth resistor, wherein the third resistor and the fourth resistor are at two different locations, wherein the high voltage peeking module measures a firing voltage at a transceiver; and
 a muting module connected to the high voltage protection module and the receiver module, wherein the muting module is configured to prevent saturation of the receiver module with a low impedance interface.

* * * * *